United States Patent [19]
Lee et al.

[11] Patent Number: 5,051,860
[45] Date of Patent: Sep. 24, 1991

[54] ELECTRO-STATIC DISCHARGE PROTECTION CIRCUIT WITH BIMODAL RESISTANCE CHARACTERISTICS

[75] Inventors: Kowk Fai V. Lee; Alan Lee, both of Irvine; Melvin L. Marmet, San Clemente; Kenneth W. Ouyang, Huntington Beach, all of Calif.

[73] Assignee: Western Digital Corporation, Irvine, Calif.

[21] Appl. No.: 351,670

[22] Filed: May 12, 1989

[51] Int. Cl.$^5$ ............................................... H02H 9/04
[52] U.S. Cl. ........................................ 361/58; 361/56; 361/91; 361/111; 357/23.13
[58] Field of Search ...................... 361/56, 58, 91, 111; 357/23.13, 42

[56] References Cited

U.S. PATENT DOCUMENTS 4,086,642  4/1978  Yoshida et al. ........................ 361/58
4,605,980  8/1986  Hoartranft et al. .................... 361/91

OTHER PUBLICATIONS

I. C. Chen et al., "The Effective Channel Hot Carrier Stressing on Gate Oxide Integrity in MOS FET", Proc. Int'l. Reliability Physics Symposium, 1988.
N. Khurana et al., "ESD on CHMOS Devices—Equivalent Circuits, Physical Models and Failure Mechanism", Proc. Int'l. Reliability Physics Symposium, 1985.
C. Duvvury et al., "ESD Protection Reliability on One Micron CMOS Technologies", Porc. Int'l Reliability Physics Symposium, 1986.
N. H. E. Weste et al., "Principles of CMOS VLSI Design", pp. 224–231, Addion-Wesley Publishing Company.
E. Fujishin et al., "Optimized ESD Protection Circuits for High-Speed MOS/VLSI", Proc. Custom Integrated Circuits Conference, May 1984, p. 569.
A. Ochoa, Jr., et al., "Snap-Back: A Stable Regenerative Breakdown Mode of MOS Devices", IEEE Trans. on Nuclear Science, vol. NS-30, No. 6, Dec. 1983, p. 4127.
L. R. Avery, "Using SCR's as Transient Protection Structures in Integrated Circuits", RCA DSRC, Princeton, N.J.

*Primary Examiner*—Todd E. Deboer
*Attorney, Agent, or Firm*—Spensley Horn Jubas & Lubitz

[57] ABSTRACT

An electrostatic discharge protection circuit employing an extended resistive structure having bimodal resistance characteristics in series with an input/output buffer circuit and an input/output electrical contact pad on an integrated circuit. The extended resistive structure is integrally formed with the device or devices in the buffer circuit most susceptible to damage due to ESD breakdown effects. In a first resistance mode during normal circuit operations, the resistor has a low resistance value and introduces virtually no additional load to the input/output buffer circuitry. In a second mode of operation during ESD discharge, the resistor has a second significantly higher resistance which reduces current values during the ESD event thereby protecting the buffer circuit. Thick oxide snap-back device is also employed to provide a parallel ESD discharge path with low power dissipation.

10 Claims, 3 Drawing Sheets

ELECTRO-STATIC DISCHARGE PROTECTION CIRCUIT WITH BIMODAL RESISTANCE CHARACTERISTICS

BACKGROUND OF THE INVENTION

1. Field of the Invention

The present invention relates to solid state devices of the type employing a large number of semiconductor devices on an integrated circuit chip. More particularly, the present invention relates to input/output buffer circuits for such integrated circuit chips.

2. Description of The Prior Art and Related Information

Electro-Static Discharge (ESD) is an increasingly significant problem in integrated circuit design. Such potentially destructive electrostatic pulses are due to various transient sources such as human or machine handling of the integrated circuit chip during processing, assembly and installation of the chip. Such ESD events will typically originate at one or more of the integrated circuit electrical contact pads with the specific discharge path varying with the integrated circuit design and the size and polarity of the electrostatic charge applied to the pad. Increased device packing densities and diminished device geometries in modern VLSI chips have generally increased the susceptibility to damage from ESD pulses.

Having effective on-chip protection against ESD is very important because elaborate and expensive environmental controls can then be avoided when the integrated circuit is being handled by human operators and assembly machines. Also, for applications where the chip is unavoidably positioned adjacent sources of electrostatic buildup or high voltage rails such on-chip protection is the only type of protection against ESD available. Since the first circuitry electrically connected to the integrated circuit pads is normally some type of input/output buffer circuit, it is such circuitry which must bear the brunt of the ESD problem. Such input/output buffer circuitry serves to buffer the logic devices on the integrated circuit, which typically operate at relatively low voltage and current levels, from the voltage and current levels on the input/output pad which interfaces with external devices. In the case of a typical CMOS (Complimentary Metal Oxide Semiconductor) integrated circuit design, the CMOS devices in the integrated circuit will typically be buffered from the input/output pads by one or more CMOS inverters having wide Field Effect Transistors (FETs) which serve to buffer the internal logic gates from the input/output pad. Therefore, in a typical ESD event, a high voltage applied to an input/output pad would result in a high discharge current to flow through one of the legs of the CMOS inverter gate to $V_{dd}$ or $V_{ss}$, respectively. One type of discharge path may occur from the output pad through the n channel FET through to $V_{ss}$. Depending upon the polarity of the ESD voltage pulse supplied to the pad, the discharge may either proceed via an avalanche breakdown of the drain/channel junction of the n channel FET or via a forward biasing of the drain/channel diode. The avalanche breakdown type of discharge path is the most destructive since it is most likely to result in irreversible damage to the structure of the n channel FET.

Figure 1:
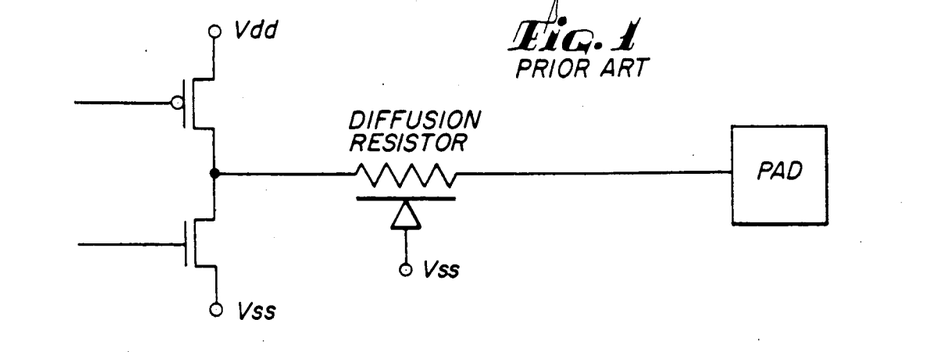
FIG. 1 is an electrical schematic drawing of a prior art electrostatic discharge protection circuit.

In FIG. 1, a prior art approach to protection of an integrated circuit from ESD events is illustrated schematically for a simple CMOS inverter buffer circuit coupled to an integrated circuit output pad. As shown in FIG. 1, a diffusion resistor is positioned in series with the output pad and the buffer inverter. Such diffusion resistor will typically be an n or p type diffusion into the substrate of the integrated circuit having a sufficiently high resistance value such that upon occurrence of an ESD event, the discharge current through the p FET or n FET of the inverter will be reduced to an acceptable value. Since the resistor is formed as a diffusion into the substrate, the diffusion resistor also provides an alternate current path for the discharge current into the substrate, which is typically coupled to $V_{ss}$. For this reason, the diffusion resistor is also schematically indicated with a diode symbol in FIG. 1 to illustrate the diode type contact between the diffusion and the substrate which provides this alternate current path.

Various modifications to integrated circuit designs, in addition to packing density, have increased the susceptibility of modern VLSI integrated circuits to ESD damage. One of many desirable characteristics of a CMOS integrated circuit is the ability to conduct a large amount of current. In order to achieve this design goal, the physical structure of a CMOS integrated circuit must undergo various modifications. Two of the most useful have been a reduction in the thickness of the gate oxide underneath the gate electrode, and a reduction in the gate length dimension. Since the current conduction capability of a CMOS integrated circuit device is inversely proportional to both gate oxide thickness and the physical gate length, to the first order, reducing these dimensions has been the design modification of choice in the semiconductor industry. For example, current CMOS integrated circuits have gate oxides which may be on the order of 200 Å or less in thickness. This is in contrast to earlier designs where gate oxide thicknesses of 1,000 Å were typical. Since the breakdown voltage of the gate oxide is proportional to its thickness, increasing at approximately one volt per 10 Å of gate oxide, it will be appreciated that modern CMOS gate oxides are subject to breakdown at significantly lower voltages than earlier ICs, for example, 20 volts or less. Thus, shorting of the buffer FETs through degradation of the gate oxide during an ESD event may occur at relatively low voltages. The damage caused by this type of ESD discharge is often quite serious since the gate oxide will generally be permanently degraded by such ESD breakdown of the oxide.

The reduced physical dimensions in an active transistor, also give rise to a phenomenon known as "hot electron" injection; where high electric fields promote the dissociation of electron/hole pairs and the tunneling of energetic electrons into the gate oxide. The presence of these electrons in the gate oxide creates a fixed charge which further modifies the electric field in the channel region of the CMOS device, resulting in a higher conductivity at a given stimulus on the gate electrode. This change in the conductivity parameter is cumulative and can result in unreliable device parameters. This "hot electron" injection mechanism is also inversely proportional to the thickness of the oxide underneath the gate electrode and the length of the conductive channel underneath the gate electrode. Subsequent events will tend to follow the same discharge path through the weakened gate oxide and such current "lock-on" onto the weakened gate oxide will ultimately destroy the buffer FET. Gate oxides weakened by a reverse bias breakdown stress are especially susceptible to hot carrier injection at the point of weakness. Hot carrier injection is able to induce a weakness in the gate oxide by itself, through joule heating of the oxide by the increased current flowing in the channel area directly underneath the oxide. Weakening of the oxide, allowing enhanced hot carrier injection, resulting in increased current flow below the point of weakness, further weakening the oxide, results in ever increasing current in a run-away effect, which eventually destroys the device. See, for example, I.C. Chen, et al., The Effective Channel Hot Carrier Stressing on Gate Oxide Integrity in MOS FET, Proc. Int'l Reliability Physics Symposium, 1988; N. Khurana, et al., ESD on CHMOS Devices - Equivalent Circuits, Physical Models and Failure Mechanisms, Proc. Int'l Reliability Physics Symposium, 1985. Various other factors have also contributed to the increased susceptibility of modern VLSI integrated circuits and in particular CMOS integrated circuits to ESD damage. See, for example, C. Duvvury, et al., ESD Protection Reliability in One Micron CMOS Technologies, Proc. Int'l Reliability Physics Symposium, 1986. The aforementioned problems resulting from reduced device dimensions become particularly significant for gate oxide thicknesses less than approximately 275 Å and channel lengths less than approximately 2 microns. Further increases in CMOS integrated circuit performance, i.e., increased current drive capability, through reduction of the gate oxide thickness and reduction of the gate length dimension, will result in increased susceptibility to the problems of low breakdown voltages and hot carrier injection. These problems must be solved before further advances in increasing device performance through reducing device dimensions may be practically accomplished.

The most common approach to overcoming the aforementioned problems in protecting modern VLSI integrated circuits against ESD damage has been to increase the resistance of the resistor placed in series between the pad and the buffer circuit. Since this increases the load driven by the buffer circuit, however, this approach will be unacceptable for a great many applications. For example, in an output buffer circuit required to drive a relatively high current load through the output pad, such a high resistor in series with the output pad will be unacceptable. Various other applications, such as applications requiring fast response times, will similarly not be compatible with a high resistance in series with the pad.

Figure 2:
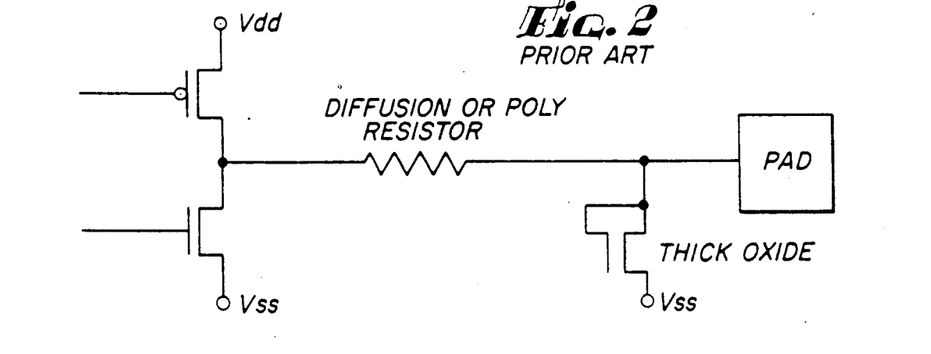
FIG. 2 is an electrical schematic drawing of an alternate prior art electrostatic discharge protection circuit.

An alternate approach has been to employ a thick oxide device as a parallel discharge path in the input/output buffer circuit. This approach is illustrated in FIG. 2. As shown schematically in FIG. 2, the thick oxide device is a field effect transistor having the gate tied to the input from the pad. The oxide thickness is chosen to provide a threshold voltage for the device such that the device turns on at a desired ESD protection voltage, for example, 30 volts. Thus, when an ESD pulse is applied to the pad, the thick oxide FET will rapidly turn on when the voltage rises above the threshold voltage thereby providing channel conduction and an alternate current discharge path for the ESD pulse. An opposite conductivity type field effect transistor may also be provided which turns on for ESD pulses of the opposite polarity. Also, as indicated in FIG. 2 the thick oxide FET may be combined with a diffusion or polysilicon resistor to provide additional protection against ESD pulses.

As noted above, however, the thin gate oxides of modern CMOS devices are susceptible to relatively low voltage ESD pulses and may break down before the thick oxide FET turns on. Such lower voltage pulses are thus a significant problem. Making the oxide thinner and lowering the threshold voltage thick oxide device will not provide a suitable solution since this then subjects that device to degradation of its gate oxide in response to ESD pulses. Therefore, this device may ultimately fail removing the protection to the circuit and possibly even shorting the circuit. The use of resistors noted above, also have inherent limitations due to the disadvantages of placing a high resistance in series with the buffer circuit and pad.

Accordingly, a need presently exists for an improved integrated circuit design which provides increased resistance to ESD pulses over a wide voltage range without introducing undesirable loads into the input/output circuitry.

SUMMARY OF THE INVENTION

The present invention provides an Electro-Static Discharge (ESD) protection circuit for integrated circuits providing extremely effective ESD protection over a wide range of ESD pulse voltages.

The present invention further provides an ESD protection circuit having low resistance during normal operation but very high local resistance during ESD pulses.

The present invention further provides an ESD protection circuit readily compatible with modern CMOS process technology.

The present invention provides an ESD protection circuit employing an extended resistive structure integrally formed with one or more input/output buffer devices adjacent the integrated circuit chip contact pads. In a preferred embodiment, the buffer devices include one or more wide field effect transistors (FETs) forming a buffer between the integrated circuit logic devices and the input/output pad and the extended resistive structure is formed in the same substrate and extends adjacent the wide source or drain regions of at least one of the buffer FETs. For example, in the case of an n channel FET forming part of an output buffer circuit, the extended resistive structure is formed by an n- well region adjacent the drain of the n channel FET and extending the full width thereof. The n- well region is in turn electrically connected to the integrated circuit output pad through an n+ contact diffusion. In a conventional twin tub CMOS process, the n- extended resistive structure may be formed by forming an additional n+ diffusion in the preexisting n well regions and forming the n well FETs adjacent the well boundary.

Since the wide n- well resistive structure provides a wide current path for the current flow to the drain of the buffer FET, it has a very low resistance during normal operation of the circuit. During the occurrence of an ESD event, however, the n channel field effect transistor will tend to break down at a single point along the extended width of the device. Current flow from the ESD pulse will thus flow from the pad through the n- well toward the point of breakdown in a funnel-shaped manner, confining the highest current densities to a very small area of the resistor. This results in an effective resistance for the ESD mode of operation which is as much as one thousand times greater than during normal operation, thereby effectively limiting current during the ESD pulse. Accordingly, the extended resistive structure provides a bimodal resistance characteristic with a very low resistance during normal circuit operation and an extremely high resistance during an ESD event. Damage to the field effect transistor, and in particular to the gate oxide of the field effect transistor, is thus effectively eliminated without introducing a significant load into the circuit.

In a preferred embodiment, the ESD protection circuit of the present invention further includes a thick oxide snap-back device coupled between the output buffer devices and the output pad to provide a parallel discharge path for ESD pulses. The thick oxide snap-back device is a gateless field effect transistor structure employing a thick oxide over the channel region thereof. Since there is no gate, conduction through the device is initiated by avalanche breakdown rather than channel turn-on as in a conventional field effect transistor. In response to an ESD pulse such avalanche breakdown triggers the snap-back device into a lower voltage mode characterized by a "snap back" in the current vs. voltage profile of the device. This voltage snap-back thus provides a parallel path for the ESD pulse with relatively low power dissipation. The thick oxide provides an insulation for hot carriers introduced into the channel of the snap-back device during the avalanche breakdown and snap-back modes thereby preventing destruction of the oxide and shorting through to adjacent layers of metallization after even repeated ESD pulses through the snap-back device. Additionally, the lack of a gate obviates additional process steps and chip area otherwise needed for the gate.

The combination of the extended resistive structure and the thick oxide snap-back device provides extremely effective resistance to ESD pulses through a very wide voltage range. Excellent resistance to ESD pulses both under standardized Human Body Model tests and Charge Device Model tests is provided. Additionally, the bimodal resistance characteristics of the extended resistive structure with very low resistance operation during normal conditions allows the present invention to be readily employed even in high output current driver applications or other applications where a high load in the buffer circuit cannot be tolerated. Further advantages of the present invention will be appreciated from the following detailed description of the invention.

DETAILED DESCRIPTION OF THE INVENTION

Figure 3:
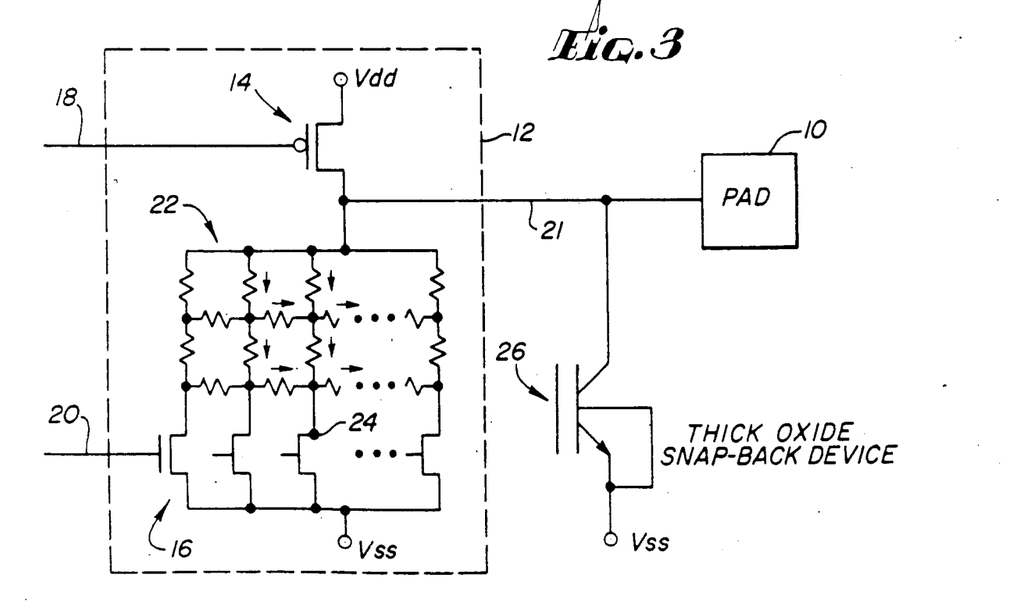
FIG. 3 is an electrical schematic drawing of the electrostatic discharge protection circuit of the present invention.

Referring to FIG. 3, the Electro-Static Discharge (ESD) protection circuit of the present invention is illustrated in an electrical schematic drawing. In a preferred embodiment the ESD protection circuit is integrated with an output buffer circuit forming part of a VLSI integrated circuit chip. The integrated circuit chip will typically have a number of electrical contact pads for both input and output electrical connections with external devices. Each pad and associated buffer circuitry will typically require some type of ESD protection circuitry. For convenience, however, the present invention is illustrated in FIG. 3 for a single output pad 10.

As shown in FIG. 3, the logic devices on the integrated circuit chip are electrically buffered from output pad 10 by means of a buffer circuit 12. In CMOS integrated circuit applications, the buffer circuit 12 may typically take the form of a CMOS inverter gate employing a p channel Field Effect Transistor (FET) 14 and n channel FET 16 coupled between a first reference voltage $V_{dd}$ and a second reference voltage $V_{ss}$. The inverter formed by p FET 14 and n FET 16 thus buffers the signals applied from the CMOS logic devices (not shown) provided along lines 18, 20, respectively, and provides them to output pad 10 along line 21. In general, however, it will be appreciated that the buffer circuit 12 may take a variety of different forms depending on the specific integrated circuit, the specific application and drive requirements for output pad 10, as well as the environment in which the integrated circuit chip is intended to be used and hence the susceptibility to ESD pulses and power surges. For example, in certain applications the possibility exists of electrical connection of the pad 10 to relatively high voltage positive rails present in the application environment of the integrated circuit chip. In this type of application, the presence of p diffusions directly coupled to pad 10 must be avoided to prevent the possibility of a direct current path being formed through such diffusion into the substrate of the integrated circuit thereby providing a short circuit from the high voltage power rail. In this case, the buffer circuit 12 will employ only n channel devices such as n FET 16 illustrated in FIG. 3. Other applications may introduce other limitations and design consideration on the buffer circuitry 12. Additionally, it will be appreciated that the present invention is not limited to CMOS integrated circuits but is also applicable to n MOS, p MOS, bipolar and BiMOS integrated circuits as well as integrated circuit structures employing GaAs and other well-known semiconductor materials.

Figure 6:
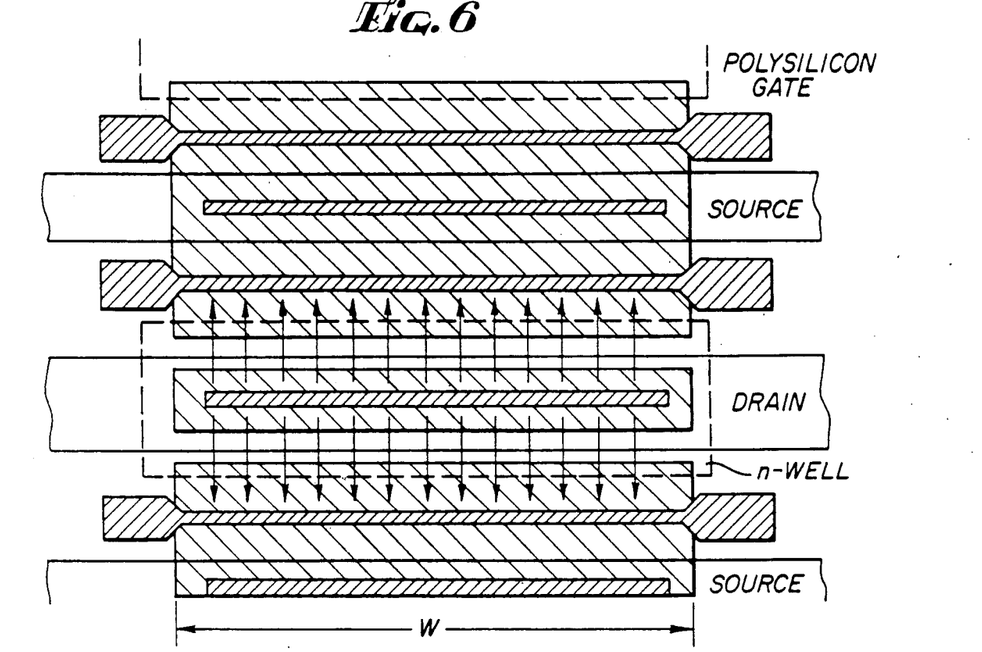
FIG. 6 is a top view of the circuit of the present invention illustrating current flow during normal operation.
Figure 7:
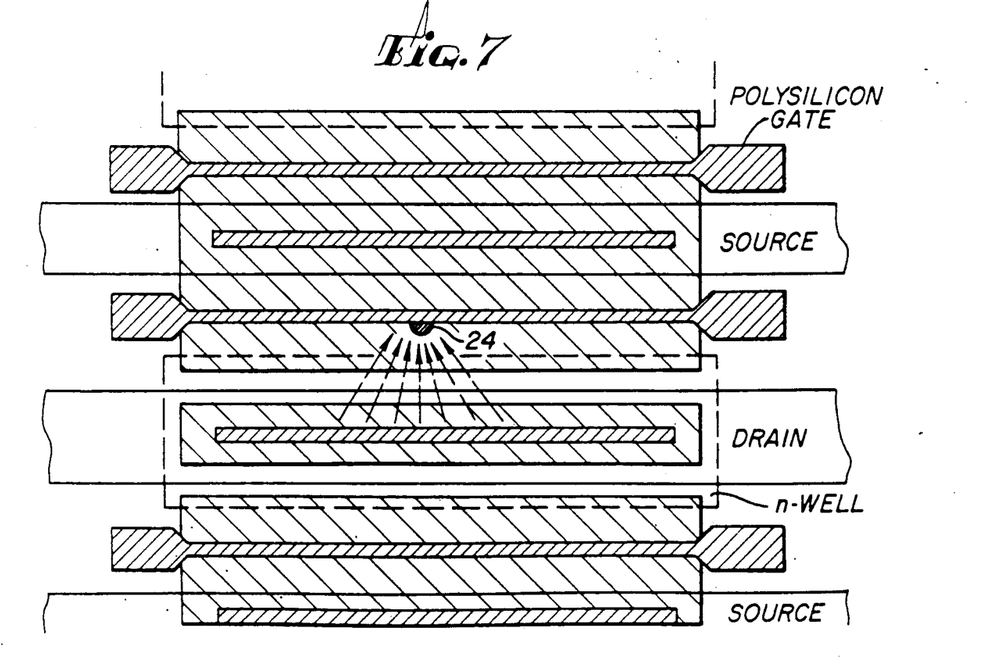
FIG. 7 is a top view of the circuit of the present invention illustrating current flow during an ESD event.

As illustrated schematically in FIG. 3 by the parallel n FET configuration 16, the FETs employed in the buffer circuit 12 are of an extremely wide design. For example, the buffer FETs 14, 16 may be 100 microns wide or more. (Although p FET 14 will also typically be of a very wide design, for simplicity in FIG. 3 it is illustrated in a conventional manner.) The wide configuration of the FETs allows a relatively high current flow to buffer the circuitry in applications where a relatively high output driver current is required. It will be appreciated, however, that the size of the buffer FETs will vary with the specific integrated circuit design and application. Also, it will be appreciated that in general a plurality of FETs 16 and 14 may be employed in parallel (as illustrated in FIGS. 6 and 7 discussed below) for driving a specific output pad 10 and only two are illustrated in FIG. 3 for simplicity.

As illustrated schematically in FIG. 3, an extended resistive structure 22 is provided in series between the pad 10 and n channel FET 16. The extended resistive structure 22 provides a two dimensional resistive path illustrated by a two-dimensional network of resistors in FIG. 3. This extended resistive structure 22 will preferably provide a resistive path extending the full width of the n channel field effect transistor 16. As will be appreciated from FIG. 4, described in more detail below, a preferred implementation of the extended resistive structure 22 employing an n well structure actually provides a three dimensional extended current path. The extended nature of the resistive path illustrated by the two-dimensional resistive structure 22 in FIG. 3 gives rise to a bimodal resistance characteristic. More specifically, the effective resistance of extended resistive structure 22 is at a low value when the current is flowing evenly along the entire width of a resistive structure 22 into the n channel FET 16. The effective resistance switches to a very high value, however, when the current is crowded into a relatively narrow region of the resistive structure 22 in response to an ESD breakdown of the n channel FET at a breakdown point 24. This focusing of the current in the sheet resistor 22 is illustrated by the arrows along the portions of the two-dimensional network of resistors adjacent breakdown point 24 in FIG. 3.

Figure 5:
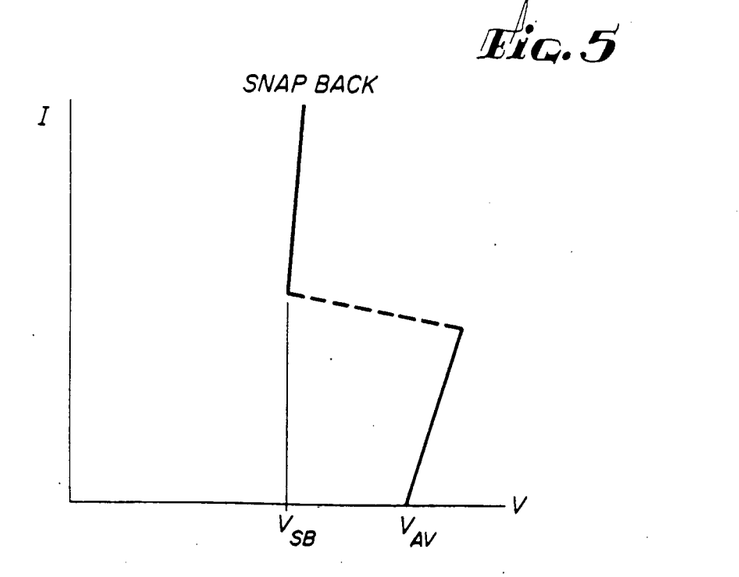
FIG. 5 is a drawing of the current/voltage characteristics of a snap-back device.

As illustrated in FIG. 3 the ESD protection circuitry of the present invention, preferably also includes a thick oxide snap-back device 26. The snap-back device 26 provides a parallel path to $V_{ss}$ to provide an additional path for the ESD current and hence further protection for the integrated circuit against ESD pulses. In particular, for sufficiently high voltage pulses applied to pad 10, the thick oxide snap-back device 26 will turn on quite rapidly and provide a low resistance path for the ESD current which will shunt substantially all the ESD pulse through device 26 to $V_{ss}$. The snap-back device 26 employs a gateless field effect transistor structure with a thick oxide region formed over the channel in place of a gate oxide. Since the snap-back device 26 does not have a gate structure, the device is turned on by avalanche breakdown across the drain/channel junction rather than by channel turn-on. The current/voltage characteristics of the device 26 after turn on, as illustrated in FIG. 5, give rise to the name "snap-back" for the device due to the characteristic shape of the current vs. voltage curve. As may be seen from inspection of FIG. 5, the snap-back device 26 begins to turn on once the voltage applied to the drain thereof reaches the avalanche voltage $V_{AV}$ of the drain/channel junction of the device. Once the snap-back device 26 turns on through avalanche breakdown, the voltage will rapidly "snap back" through a negative resistance regime (indicated by a dashed line) to a second substantially lower voltage $V_{SB}$. This snap-back effect is believed to be due to the tendency of the channel/source junction to become forward biased by the avalanche current injected into the channel region of the device which in turn injects additional current into the channel region. Due to the high electric field, the new current injected into the channel region will be swept to the drain and there, through impact ionization, will cause further electron/hole pair creation and further multiplication of current. This rapid multiplication of carriers in the region adjacent the drain causes the voltage across the device to drop rapidly to the lower snap-back voltage $V_{SB}$ and the second part of the current voltage curve illustrated in FIG. 5. As will be appreciated from FIG. 5, this snap-back portion of the operating range of the snap-back device, being at a substantially lower voltage than the voltage at which the device breaks down, will result in significantly reduced power generation from the ESD pulse than would otherwise be the case. This has significant advantages in reducing damage to the snap-back device 26 itself and to the remainder of the circuit adjacent the snap-back device due to power generated from the ESD pulse. It will be appreciated from the foregoing that the combination of the extended resistive structure 22 having a bimodal resistance characteristic and the thick oxide snap-back device 26 provides extremely effective ESD protection for a wide range of ESD voltage pulses. Typically, at any voltage above 16, the n channel FET 16 will enter avalanche and snap back first. But the voltage at the pad may not be clamped instantly and the snap-back device 26 will eventually snap back. When it does, it will shunt the rest of the ESD current to $V_{ss}$. In this case, the breakdown will typically occur at a single point along the wide n channel FET 16, e.g. at point 24 illustrated in FIG. 3, causing the resistive structure 22 to present a very high resistance due to the current crowding effect as current is channeled toward breakdown point 24. This high resistance mode of resistive structure 22, thereby severely limits the current of the pulse through the n channel FET 16. Thus, the damage due to the pulse is greatly minimized and permanent damage to the gate oxide of the n channel FET 16 is effectively eliminated.

Figure 4:
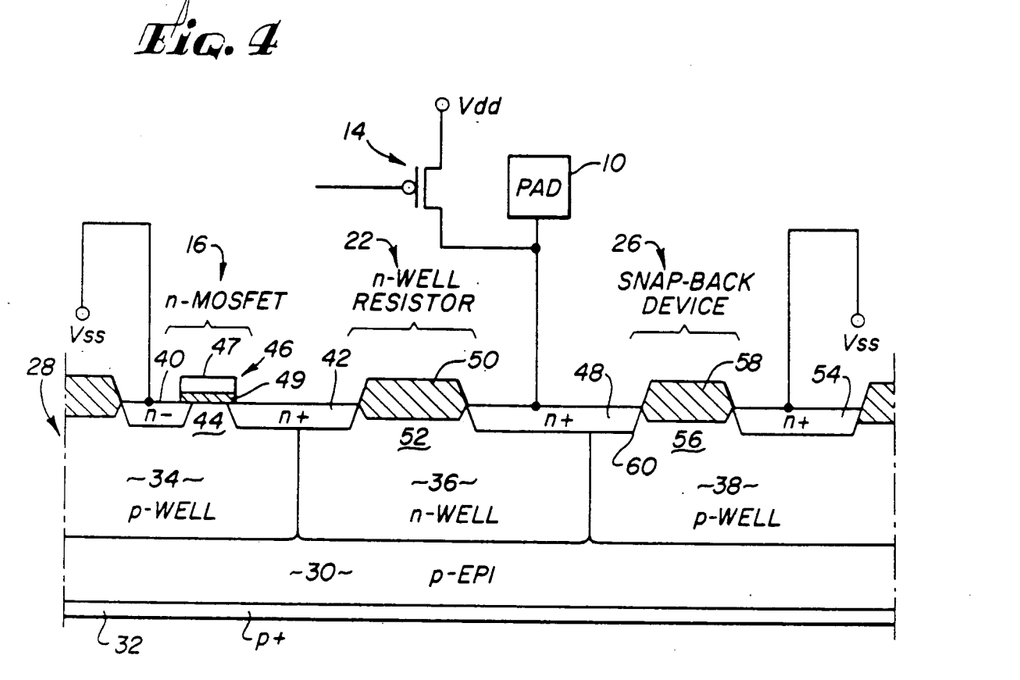
FIG. 4 is a cross-sectional drawing of the circuit of the present invention implemented as part of a CMOS integrated circuit.

Referring to FIG. 4, a preferred embodiment of the ESD protection circuit of the present invention is illustrated implemented in a CMOS integrated circuit. As shown in FIG. 4, the CMOS integrated circuit includes a substrate 28 having a p— epitaxial layer 30 formed in a higher doped p type body portion 32 of the substrate 28. As illustrated in FIG. 4, the relative depths and lengths of the regions are not shown to scale for space considerations. For example, the p type body portion 32 will in general be substantially thicker than the epitaxial layer 30. For example, for a typical CMOS process the body portion 32 may be 500–600 microns deep, with epitaxial layer approximately 10–20 microns deep. The p type body portion 32 will typically be coupled to $V_{ss}$ for example, through a p+ diffusion (not shown). The portion of the integrated circuit illustrated in FIG. 5, also includes a p well 34, n well 36 and a second p well 38 formed in the p— epitaxial layer 30. The n and p well regions of the CMOS integrated circuit of FIG. 4 may be implemented, using a conventional twin tub process. These n and p well regions 34, 36 and 38, may for example have a depth of approximately 4–5 microns. N channel MOS FET 16 is formed in p well 34, having an n+ source diffusion 40, n+ drain diffusion 42 and a channel region 44 formed by the portion of p well 34 between source and drain regions 40, 42, respectively. The n+ source and drain regions 40, 42 may be, for example, 0.3–0.4 microns deep with doping levels of $10^{19}$ As atoms/cc.

As may be appreciated from FIGS. 6 and 7, the field effect transistor 16 and snap-back device 26 are generally of a width W much greater than the length direction, i.e., the direction of current flow, of the devices, although FIGS. 6 and 7 are not drawn to scale. For example, the width of the devices W may be several thousand microns or greater with a channel length of approximately 0.5–2 microns. For relatively high driver current output pads much wider buffer FETs may be employed, for example, 2–3,000 microns wide, with chip area considerations providing the primary limitation to device width. Various other applications will have differing requirements, however, and accordingly varying relative device geometries.

Referring to FIG. 4, channel region 44 is covered with a conventional gate structure 46 illustrated schematically in FIG. 5, having a gate electrode 47, preferably of polysilicon, and gate oxide 49 preferably of $SiO_2$. The gate oxide 49 which is of approximately 200 Å thickness or less, is subject to the most severe damage in ESD events. As shown in FIG. 4, n channel FET 16 has its n+ drain diffusion 42 extending laterally into adjacent n well 36. It will be appreciated that due to diffusion of dopants, the boundary between p well 34 and n well 36 is not sharp as illustrated schematically in FIG. 4. Hence, the length of n+ region 42 required to extend across the boundary from p well 34 to n well 36 will vary with the specific process employed. Additionally, a second n+ diffusion 48 is formed in n well 36, spaced apart laterally from n+ region 42. The drain electrical contact is not made at n+ drain diffusion 42, but at the second n+ diffusion 48. The electrical connection to pad 10 is illustrated schematically in FIG. 4, but pad 10 will also be formed on substrate 28 and will be electrically coupled to n+ contact region 48 through a metallization layer (not shown). A thick oxide spacer region 50 is formed between n+ regions 42 and 48 to prevent shorting therebetween. A portion of n well 36 between n+ regions 42 and 48 thus forms an extended resistive structure 22 which is in series between pad 10 and n channel FET 16 and which is integrally formed with the drain region 42 of n FET 16. The resistance of the resistive structure 22 formed by the n well 36 will vary with the doping concentration of n well region 36. In a conventional CMOS twin tub process, the doping level of n well 36 will be approximately $10^{15}$ atoms/cc of phosphorus. This will provide a surface resistance through a surface region 52 of n well 36 of approximately 550–700 $\Omega/\square$. Such a sheet resistance provides a suitable bimodal resistance characteristic for the resistor 22 for many applications. However, it will be appreciated that the effective resistance of resistive structure 22 may be readily varied by increasing or decreasing the doping concentration of n well 36.

Referring to FIG. 4, n+ region 48, which is electrically coupled to contact pad 10, may advantageously also be employed as a drain region for snap-back device 26. To integrate n+ region 48 with the snap-back device 26, n+ region 48 is thus preferably extended into p well 38 as illustrated in FIG. 4. Another n+ region 54 is also formed in p well 38 which is in turn electrically coupled to $V_{ss}$. N+ region 54 thus forms the source region of snap-back device 26. A channel region 56 is formed by the p-well region between spaced apart n+ regions 48 and 54. The base/channel region 56 is in turn covered with a thick oxide layer 58 chosen of a thickness sufficient to absorb hot carriers created during the snap-back operation of snap-back device 26. For example, in a preferred embodiment of the present invention, an oxide thickness of 1.87 microns has been found to provide suitable protection during repeated ESD events. The length of channel region 56 may be approximately 2.25 microns to give sufficient spacing between the n+ regions 48 and 54 to prevent shorting. The relative size of n+ regions 48, 54 and channel base region 56 may vary widely with the specific integrated circuit layout requirements of the fabrication process.

It will be appreciated from inspection of FIG. 4 that snap-back device 26 has the basic structure of a field effect transistor without any gate structure, however, to initiate channel conduction for the device. Accordingly, snap-back device 26 must turn on by virtue of avalanche breakdown of the junction 60 between n+ region 48 and p-type region 56 in response to high voltages applied to pad 10 during an ESD pulse. Breakdown voltage of junction 60 will depend upon the carrier concentration of the respective regions 48 and 56. For typical n+ doping concentrations employing As dopant levels of approximately $10^{19}$ atoms/cc used in modern CMOS processes, and conventional p well concentrations the breakdown voltage will be approximately 20 volts. As described above in relation to FIG. 5, after snap-back device 26 is turned on by avalanche breakdown of junction 60, a sequence of events will rapidly occur to snap back the device into a lower voltage mode and hence lower power dissipation. For example, the snap-back voltage $V_{SB}$ illustrated in FIG. 4 may be approximately 10 volts for a snap-back device having a breakdown volta $V_{AV}$ of approximately 18 volts. Thus, a very substantial reduction in power dissipation is provided.

Referring to FIGS. 6 and 7, a top view of a portion of a CMOS integrated circuit employing the n well extended resistive structure is shown illustrating the normal and ESD current flows in the device, respectively. The CMOS circuit of FIGS. 6 and 7 corresponds generally to a top view of a portion of FIG. 4, employing three buffer FETs in parallel having shared source and drain regions. This type of configuration provides a high current capacity buffer and may be advantageously employed, for example, in applications requiring high output drive currents. Also, the snap-back device 26 is not illustrated in FIGS. 6 and 7 since several parallel buffer FETs may be employed with snap-back device 26 integrated therewith as shown in FIG. 4. Alternatively, the snap-back device 26 may be positioned away from the buffer FETs rather than integrated therewith as in FIG. 4, for example, where chip layout considerations mitigate in favor of a side by side arrangement.

As illustrated in FIG. 6, during normal operation of the integrated circuit, the current flow in the device will be relatively uniform across the extended width W in a direction indicated by the arrows from the drain contact from n+ region 48 through the extended resistive path formed by n well 36 to the n+ drain diffusion 42. The current in turn will then flow through the n channel FET 16 to source diffusion 40 as in normal FET operation. For a sheet resistance of n well region 36 of approximately 625 $\Omega/\square$ and a device width of approximately 600–750 microns, this results in an effective resistance for the resistor 22 as low as 7 $\Omega$. This provides essentially a negligible load on the buffer circuitry and accordingly even relatively high drive currents may be provided by the buffer for the output pad coupled thereto.

Referring to FIG. 7, the current flow during an ESD event is shown to be radically different from normal current operation such as illustrated in FIG. 6. During an ESD event wherein the n channel MOS FET 16 undergoes a breakdown, such breakdown will occur at a specific point 24. Since the rest of the device is turned off, the current will be forced to flow in funnel-shaped path to the breakdown point 24. This "current crowding" is illustrated by the arrows in FIG. 7. This current crowding will result in an extremely high effective resistance during ESD events. For example, for the same geometries and doping levels discussed in relation to FIG. 6, the effective resistance during such an ESD event will be approximately 60–120 $\Omega$. This bimodal resistance characteristic thus provides approximately a ten fold increase in effective resistance of the resistive structure 22 for ESD events over normal device operation. For other geometries, as much as a one hundred times increase may be provided. This extremely high effective resistance thus provides a very effective protection for the n channel FET 16 from serious damage during the ESD pulse. Additionally, the high resistance will tend to increase the potential applied to snap-back device 26 causing it to turn-on and shunt the ESD current, even when the buffer FET breaks down first.

Accordingly, the present invention provides effective ESD protection for a wide range of ESD pulse voltages. In tests, the circuit has performed exceedingly well under standardized Human Body Model ESD tests such as specified in Mil. Spec. 883B. At the same time, as described above, the present invention is compatible with conventional CMOS technology as well as introducing only nominal additional load into the input/output buffer circuitry which can be offset by resizing the n channel FET to be wider. Accordingly, the present invention provides an extremely effective ESD protection design for a wide variety of integrated circuit applications.

It will be appreciated by those of ordinary skill in the art that a wide variety of modifications may be made in the above-described preferred embodiment while remaining within the scope of the present invention. For example, while the preferred embodiment of the invention has been described in terms of an implementation in a CMOS integrated circuit, employing twin tub process technology, it will be appreciated that a wide variety of other types of integrated circuit process technologies may advantageously employ the present invention. Additionally, while the present invention has been described as implemented as an integral part of an n channel FET employed in an integrated circuit buffer circuit, it will be appreciated that the present invention may also be implemented with a p channel buffer device. Additionally, it will be appreciated that the present invention is applicable for input as well as output buffers, analog combined input/output buffer circuits, and in a wide variety of specific buffer circuit designs depending on the specific application. A wide variety of additional modifications are also possible to the preferred embodiment of the present invention as described above, while remaining within the scope of the present invention.

What is claimed is:

1. An improved complementary metal oxide semiconductor integrated circuit chip having a semiconductor substrate and a plurality of semiconductor devices formed thereon, and a plurality of input/output electrical contact pads for making electrical contact between external devices and respective ones of said plurality of semiconductor devices, the improvement comprising:

transistor means for providing a selective electrical coupling between at least one of said electrical contact pads and said respective ones of said plurality of semiconductor devices, wherein said transistor means is subject to breakdown conduction in response to externally generated voltage surges applied to said pad; and resistive means, electrically coupled in series between said pad and said transistor means and integrally formed with said transistor means, for providing an extended bimodal resistive path between said path and said transistor means, said extended bimodal resistive path having a first relatively low resistance path during normal integrated circuit operation and a second higher resistance path during said breakdown conduction operation of said transistor means.

2. An integrated circuit as set out in claim 1 wherein said transistor means comprises an n channel field effect transistor having a source region, a drain region, and a channel region between said source and drain regions and wherein said field effect transistor has a width substantially greater than the length of said channel region, and wherein said two terminal resistive means comprises and n well region of lower conductivity than said drain region, integrally formed with said drain region and extending substantially the full width of said field effect transistor.

3. An integrated circuit as set out in claim 2, wherein said n well region has a length substantially less than the width of said n well region and wherein said n well region is connected to said electrical contact pad such that current flows through the length direction thereof to said drain region of said field effect transistor.

4. An integrated circuit as set out in claim 1, wherein said extended resistive path is a generally two dimensional path having a sheet resistance of approximately 550–700 $\Omega/\square$.

5. An integrated circuit as set out in claim 1, wherein said transistor means comprises an n channel field effect transistor, wherein said integrated circuit further comprises a p channel field effect transistor, wherein said n channel and p channel field effect transistors are coupled in series between a first reference potential and a second reference potential source so as to form a CMOS invertor, and wherein said n channel transistor is integrally formed with and electrically coupled in series with said resistive means.

6. An integrated circuit as set out in claim 1, further comprising means, coupled between said electrical contact pad and a reference voltage, for providing a conductive path between said pad and said reference potential at a first voltage applied to said pad and providing a current path at a second lower voltage after being turned on by said first voltage.

7. An electrostatic discharge protection circuit formed on an integrated circuit having a plurality of semiconductor devices, an electrical contact pad and one or more electrical leads running from said semiconductor devices to said pad, comprising:

an n channel field effect transistor coupled to said electrical contact pad and to said one or more electrical leads and having the source thereof electrically coupled to a reference potential;

a two terminal resistor, integrally formed with the drain of said n channel transistor and electrically coupled in series between said n channel resistor and said pad so as to form a first current path between said pad and said reference potential; and a conductive device comprising a gateless field effect transistor structure coupled between said n channel transistor and said pad and providing a current shunting path parallel to the first current path to said reference potential, said conductor device having a turn-on voltage at a first avalanche breakdown voltage and a second substantially lower operating voltage.

8. An electrostatic discharge protection circuit as set out in claim 7, wherein said conductive device comprises a source region, a channel region and a drain region, and a thick oxide layer formed over said channel region and wherein said drain region is coupled to said electrical contact pad and said source region is coupled to said reference potential.

9. An electrostatic discharge protection circuit as set out in the claim 8, wherein said thick oxide layer is approximately 1-2 microns in thickness.

10. An electrostatic discharge protection circuit as set out in claim 8, wherein said reference potential is ground.

* * * * *